(12) United States Patent
Wang et al.

(10) Patent No.: US 6,977,419 B2
(45) Date of Patent: Dec. 20, 2005

(54) MOSFETS INCLUDING A DIELECTRIC PLUG TO SUPPRESS SHORT-CHANNEL EFFECTS

(75) Inventors: Hongmei Wang, Boise, ID (US); Zhongze Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,507

(22) Filed: Sep. 1, 2004

(65) Prior Publication Data

US 2005/0035408 A1 Feb. 17, 2005

Related U.S. Application Data

(62) Division of application No. 10/175,774, filed on Jun. 20, 2002, now Pat. No. 6,812,103.

(51) Int. Cl.⁷ .......................................... H01L 21/336
(52) U.S. Cl. ........................ 257/344; 257/346
(58) Field of Search ................ 257/344, 346, 257/E29.267, E29.27

(56) References Cited

U.S. PATENT DOCUMENTS

| | | | | |
|---|---|---|---|---|
| 4,963,502 A | 10/1990 | Teng et al. | ............. | 437/41 |
| 5,395,777 A | 3/1995 | Yang | ............. | 437/40 |
| 5,491,099 A * | 2/1996 | Hsu | ............. | 438/302 |
| 5,598,021 A * | 1/1997 | O et al. | ............. | 257/408 |
| 5,635,417 A | 6/1997 | Natsume | ............. | 438/130 |
| 5,640,035 A * | 6/1997 | Sudo et al. | ............. | 257/344 |
| 5,705,440 A | 1/1998 | Roh et al. | ............. | 438/294 |
| 5,759,901 A | 6/1998 | Loh et al. | ............. | 438/305 |
| 5,828,103 A * | 10/1998 | Hsu | ............. | 257/344 |
| 5,972,762 A * | 10/1999 | Wu | ............. | 438/305 |
| 6,013,554 A * | 1/2000 | Park | ............. | 438/305 |
| 6,017,801 A * | 1/2000 | Youn | ............. | 438/296 |
| 6,040,602 A * | 3/2000 | Fulford et al. | ............. | 257/344 |
| 6,074,904 A | 6/2000 | Spikes et al. | ............. | 438/223 |
| 6,083,796 A | 7/2000 | Park et al. | ............. | 438/294 |
| 6,110,786 A | 8/2000 | Gardner et al. | ............. | 438/300 |
| 6,172,402 B1 | 1/2001 | Gardner et al. | ............. | 257/347 |
| 6,232,164 B1 | 5/2001 | Tsai et al. | ............. | 438/217 |
| 6,316,322 B1 | 11/2001 | Hao | ............. | 438/305 |
| 6,326,251 B1 | 12/2001 | Gardner et al. | ............. | 438/197 |
| 6,346,729 B1 | 2/2002 | Liang et al. | ............. | 257/344 |

(Continued)

OTHER PUBLICATIONS

Hori, et al., "High Performance Dual-gate CMOS Utilizing a Novel Self-aligned Pocket Implantation (SPI) Technology", *IEEE Trans. Electron Devices, 40*, (Sep. 1993), 1675-1681.

(Continued)

*Primary Examiner*—George Fourson
(74) *Attorney, Agent, or Firm*—Schwegman, Lundberg, Woessner & Kluth, P.A.

(57) ABSTRACT

The invention provides a technique to fabricate a dielectric plug in a MOSFET. The dielectric plug is fabricated by forming an oxide layer over exposed source and drain regions in the substrate including a gate electrode stack. The formed oxide layer in the source and drain regions are then substantially removed to expose the substrate in the source and drain regions and to leave a portion of the oxide layer under the gate electrode stack to form the dielectric plug and a channel region between the source and drain regions.

15 Claims, 8 Drawing Sheets

U.S. PATENT DOCUMENTS

| | | | |
|---|---|---|---|
| 6,368,926 B1 | 4/2002 | Wu | 438/300 |
| 6,465,311 B2 | 10/2002 | Shenoy | 438/300 |
| 6,483,158 B1 | 11/2002 | Lee | 257/408 |
| 2002/0024107 A1 * | 2/2002 | Inaba | 257/408 |
| 2002/0195660 A1 | 12/2002 | Lee | 257/344 |
| 2003/0104645 A1 * | 6/2003 | Weon et al. | 438/44 |

OTHER PUBLICATIONS

Jurczak, Malgorzata, et al., "Dielectric Pockets—A New Concept of the Junctions for Deca-Nanometric CMOS Devices", *IEEE Trans. Electron Devices, 48*, (Aug. 2001), 1770-1774.

* cited by examiner

MOSFETS INCLUDING A DIELECTRIC PLUG TO SUPPRESS SHORT-CHANNEL EFFECTS

This application is a Divisional of U.S. application Ser. No. 10/175,774, filed Jun. 20, 2002 now U.S. Pat. No. 6,812,103, which is incorporated herein by reference.

FIELD OF THE INVENTION

The present invention relates to fabrication of integrated circuits and, in particular, to fabrication of submicron MOS devices.

BACKGROUND OF THE INVENTION

The structure and the various components, or features, of a metal oxide semiconductor (MOS) device such as a Field Effect Transistor (MOSFET) are generally well known. Such devices are generally formed having a source region and a drain region, of similar conductivity type, separated by a channel region, of a differing conductivity type, capped with a conductive gate. The gate to source voltage controls the passage of current through the channel region between the source and the drain regions. In a typical n-channel operation, a positive voltage is applied between the drain and the source with the source grounded to a reference potential. Due to the differing conductivity types of the channel region separating the source and the drain, usually no current flows between the source and drain. However, if a sufficiently large voltage is applied between the gate and source, the channel region will be turned on, thereby allowing current to flow between the source and the drain. The gate voltage required to induce the flow of current between the drain and the source is referred to as the threshold voltage.

A pervasive trend in modern integrated circuit manufacture is to produce transistors having feature sizes as small as possible. To achieve a high-density integrated circuit, features such as the gate conductor, source/drain regions, and interconnects to the junction must be made as small as possible. Many modern day processes employ features, which have less than 0.15 micron critical dimensions. As feature size decreases, the resulting transistor as well as the interconnect between transistors also decreases. Smaller transistors allow more transistors to be placed on a single monolithic substrate, thereby allowing relatively large circuit systems to be incorporated on a single and relatively small area. Further, smaller transistors typically have lower turn-on threshold voltages, faster switching speeds, and consume less power in their operation. These features in combination allow for higher speed integrated circuits to be constructed that have greater processing capabilities.

The benefits of high density can only be realized if advanced processing techniques are used. However, these techniques must contend with problems resulting from higher density itself. Even the most advanced processing techniques cannot in all instances offset the problems associated with small features or features arranged extremely close to one another. For example, as the channel length (distance between source and drain regions) decreases, short-channel effects (SCEs) generally occur, which can result in increased sub threshold leakage, and can become exaggerated when dimensions of the transistor and the channel region is decreased. Such a condition may be due to avalanche breakdown or punch through. Punch through occurs when the MOS transistor is biased in an off state with the gate and the source both at approximately zero volts with respect to ground, but with the drain at a voltage as high as 5 volts. Even though no flow of current is desired, drain current may still occur regardless of the zero gate voltage. This is due to the fact that under such conditions, the normal doping concentration of the channel region is not sufficient to prevent flow between the source and drain regions.

In order to eliminate punch through currents, the doping concentration in the substrate of the MOS device is raised. A so-called "punch through stop" implant is used to locally raise the doping concentration of the MOS device substrate. Typically, the punch through stop implant is made as an angle implant over the active region of the MOS device. Unfortunately, the punch through stop implant also raises the doping concentration of the substrate in the source and drain region. As a consequence of the increased doping concentration, the source-drain junction capacitance is also increased.

Currently to overcome SCEs, punch through implants, also referred to as "pocket implants," are substituted with buried dielectric plugs, which isolate vertical sidewalls of the deep regions from the channel regions except for their uppermost part—inversion layer. This prevents the transistors from the bulk punch through without reducing the depth of highly doped regions and without increasing the channel doping that has a detrimental effect for current driving capability and junction capacitance. The pocket implants may be reduced or even withdrawn. In addition, the dielectric plugs reduce junction capacitance and cut down the path of punch through current in the channel region. This technique is described in detail in "Dielectric Pockets—A New Concept of the Junctions for Deca-Manometric CMOS Devices," *IEEE Transactions on Electron Devices*, Vol. 48, No. 8, August 2001.

However, the above-described process can require extreme fine-tuning of process control parameters during dry etching to form the dielectric plugs. This requirement of a fine control on the process parameters during fabrication of the dielectric plugs can result in uncontrolled position, height, and thickness of the formed dielectric plugs, which are critical to reducing SCEs. This can also result in uncontrolled channel length and not connecting to source/drain regions to low doping drain (LDD) regions, also referred to as "Source/Drain extensions." In addition, Silicon/Nitride used in forming the dielectric plugs during the dry etching process, can result in having a poor bonding with the silicon substrate, which can further result in traps and junction leakage.

Thus, there is a need in the art for a technique to form dielectric plugs that overcomes the shortcoming of the above-described process. Further, there is a need for a feasible technique to form closely controlled dielectric plugs to reduce SCEs. In addition, there is a need for a technique to form these dielectric plugs without substantially increasing source-drain junction capacitance, and which minimizes SCEs.

SUMMARY OF THE INVENTION

The present invention provides an advanced technique for fabricating a MOSFET including a dielectric plug to reduce short channel effects without increasing source-drain junction capacitance. Further, the technique provides a fabrication process to form a self-aligned dielectric plug having good control on the position, size, and thickness of the formed dielectric plug, which are critical to reducing the SCEs. In addition, the technique provides a more robust, less complex, and more cost effective process to fabricate the device including the dielectric plug.

In one embodiment, the MOSFET is fabricated by forming a pair of low doping drain (LDD) regions substantially adjacent to a gate electrode stack on a substrate including a protective cap layer over the gate stack and a first spacer layer around the gate stack. A first layer is then removed in the substrate by etching the substrate to expose a side silicon in the LLD regions and substantially under the first spacer layer and to further expose the substrate around the gate electrode stack to form source and drain regions adjacent to the exposed LDD regions. A second spacer is then formed over the first spacer layer such that the formed second spacer layer substantially extends from the exposed source and drain regions. A second layer is then removed in the substrate around and under the formed second spacer layer and the source and drain regions to further expose the substrate around the LDD regions. The exposed substrate extends the formed side silicon in the LDD regions further into the substrate to form a sidewall and a recess for the source and drain regions. An oxide layer is then formed over the exposed substrate in the formed source and drain recesses and sidewalls such that the formed second spacer layer and the formed oxide layer substantially close the exposed LDD regions. The second spacer layer is then removed by selective etching to expose the closed LDD regions. The formed oxide layer is then substantially removed from the source and drain regions by oxide spacer etching to expose the substrate in the source and drain regions and to leave a portion of the oxide layer under the LDD regions and around the sidewalls of the source and drain regions to form a dielectric plug and a channel region between the source and drain regions to reduce short channel effects between source and drain regions. Epitaxial silicon material is then deposited in the exposed substrate such that the deposited epitaxial silicon fills the formed recesses in the source and drain regions to create a connection between the channel and the filled source and drain regions.

In another embodiment, the MOSFET is fabricated by forming a protective cap layer over a gate electrode stack disposed on a substrate over an active region surrounded by an isolation region. A first spacer layer is then formed around the gate electrode stack such that the formed first spacer layer together with the formed protective cap layer covers the gate electrode stack. A first layer is then removed in the substrate to expose the substrate to form source and drain regions such that the formed source and drain regions are disposed substantially adjacent to the gate electrode stack and apart from each other at opposite sides of the gate electrode stack. A second spacer layer is then formed over the formed first spacer layer such that the formed second spacer layer substantially extends from the exposed source and drain regions. A second layer is then removed from the substrate around the formed second spacer layer and source and drain regions to further expose the substrate to form a sidewall in the substrate and a recess for the source and drain regions. An oxide layer is then formed over the exposed substrate in the formed source and drain recesses such that the formed second spacer layer and the oxide layer substantially close the sidewalls. The second spacer layer is then removed by selective etching to expose the first spacer layer. The formed oxide layer is then substantially removed from the source and drain regions by oxide spacer etching to expose the substrate in the source and drain regions and to leave a portion of the oxide layer around the sidewalls of the source and drain regions to form a dielectric plug and a channel region between the source and drain regions. Epitaxial silicon material is then deposited in the exposed substrate such that the deposited epitaxial silicon fills the formed recesses in the source and drain regions to create a connection between the channel and the filled source and drain regions. A portion of the first spacer layer around the source and drain regions is then etched back to expose silicon regions for LDD implantation, such that the exposed regions are disposed substantially adjacent to the gate electrode stack and the source and drain regions. The exposed regions are implanted with a dopant to form a LDD region to connect the channel region with the source and drain regions. A third spacer layer is then formed over the gate electrode stack.

Additional advantages and features of the present invention will be more apparent from the detailed description and accompanying drawings, which illustrate preferred embodiments of the invention.

DETAILED DESCRIPTION OF THE INVENTION

Figure 1:
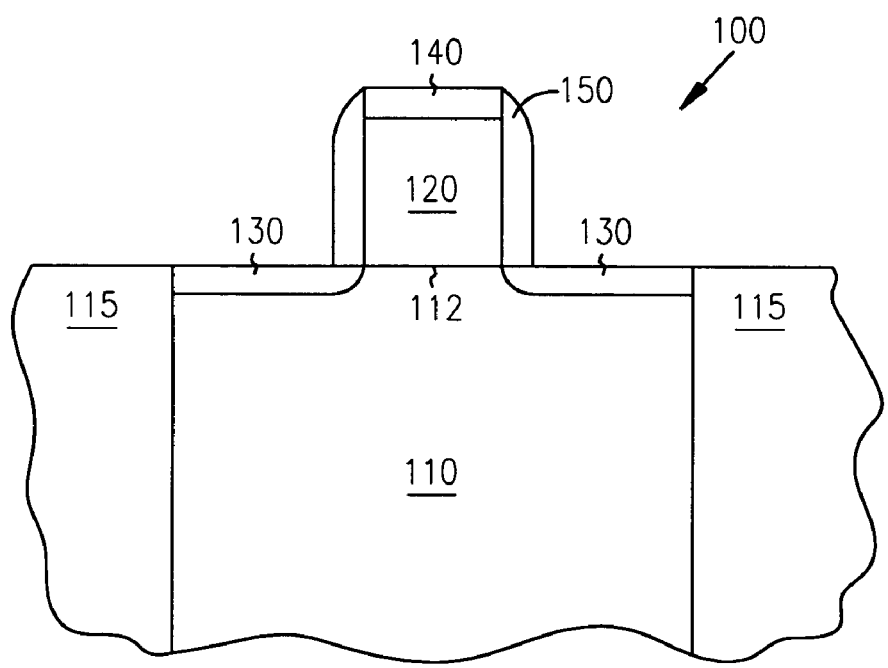
FIGS. 1, 2, 3, 4, 5, 6, and 7 are cross sectional views that illustrate various operations in forming a MOSFET device having a dielectric plug according to the present invention, with the resulting MOSFET device having the dielectric plug shown in FIG. 8.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The term "substrate" used in the following description may include any semiconductor-based structure that has an exposed silicon surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

When reference is made to a wafer or substrate in the following description, previous process steps may be utilized to form regions, junctions, or layers in or on the base semiconductor or foundation.

The present invention provides an advanced technique for fabricating a MOSFET including a dielectric plug to reduce short channel effects without increasing source-drain junction capacitance. Further, the technique provides a way to form a self-aligned dielectric plug having good control on the position, size, and thickness of the formed dielectric plug. In addition the technique provides a more robust, less complex, and more cost effective process to fabricate the device. With this technique, it is possible to simultaneously achieve a lower threshold voltage ($V_t$) and a better on/off current ratio due to the elimination of pocket implantation. In addition, removing the pocket implant reduces the junction capacitance up to 50% of what can be achieved using current technology that uses the pocket implant. Further, with current CMOS technology, shallow source/junction depth is needed for reducing the source/drain lateral diffusion. Using this technique, there is no restriction on having a shallow source/junction depth. As a result, it is easier to get low junction leakage by making deeper source/drain junction. Having an oxide plug considerably reduces carrier flow and punch through current under the channel regions. Further a superior channel performance and device scalability for both NMOS and PMOS devices can be achieved by using this technique. The technique further alleviates the need for LDD implant and the associated photo steps.

An embodiment of a method of the present invention is described with reference to FIGS. 1–8, in a method of forming the dielectric plug in a MOSFET.

Referring to FIG. 1, a portion of a semiconductor wafer including a cross-section of a gate electrode stack 100 is shown in a preliminary processing step. The wafer fragment including the gate electrode stack 100 in progress can comprise a semiconductor wafer substrate or the wafer along with various process layers formed thereon, including one or more semiconductor layers or other formation, and active or operable portions of semiconductor devices.

The wafer fragment including the gate electrode stack 100 is shown including a substrate 110, a gate electrode stack 120, and a pair of LDD implant regions 130. As shown, the substrate 110 is surrounded by field oxide layer 115. Also as shown, the gate electrode stack 120 includes a protective cap layer 140, and a first spacer layer 150.

The substrate can include a semiconductor-based structure. The semiconductor-based structure can include structures, such as silicon, SIGe, silicon-on insulator (SOI), silicon-on sapphire (SOS), doped and undoped semiconductors, epitaxial layers of silicon supported by a base semiconductor foundation, and/or other semiconductor structures. The semiconductor structure can also be based on materials, such as silicon-germanium, germanium, and/or gallium arsenide.

Formation of the gate electrode stack 120, the LDD implant regions 130, the protective cap layer 140, and the first spacer layer 150 are well known in this art and many different known processes can be used in conjunction with the present invention. In some embodiments, gate electrode stack 120 is formed by forming an active region 112 surrounded by an isolation region in the substrate 110. A gate oxide layer is then formed over the formed active region. The gate electrode stack 120 is then formed over the formed gate oxide layer region. The protective cap layer 140 is then formed over the gate electrode stack 120. The LDD regions 130 are then formed such that the formed LDD regions are disposed substantially adjacent to the gate electrode stack 120, and are further disposed apart from each other at opposite sides of the gate electrode stack 120. The first spacer layer 150 is then formed over the formed gate electrode stack 120. In these embodiments, the protective cap layer 140 is formed using dielectric materials, such as oxide and nitride. Also in these embodiments, the first spacer layer 150 is formed using materials such as, silicon oxide ($SiO_2$) and silicon nitride ($Si_3N_4$).

Figure 2:
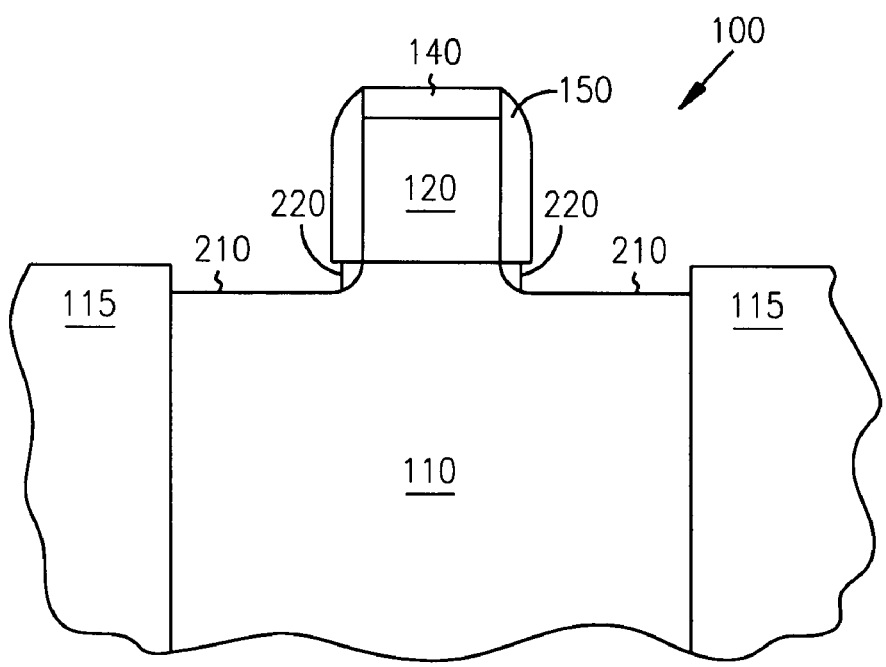

Referring to FIG. 2, a first layer 210, is then removed in the substrate 110 to expose a sidewall 220 and to further expose the substrate 110 around the LDD regions 130 and substantially under the first spacer layer 150 to form the source and drain regions. In some embodiments, removing the first layer 210 from the substrate 110 comprises removing a very thin layer of the substrate 110 using etchants that selectively etch the substrate 110 (and not the gate stack 120, the first spacer layer 150, and the field oxide layer 115). In some embodiments, the etching depth of the first layer 210 is in the range of about 50 to 700 Å. In these embodiments, the formed source and drain regions are source and drain extensions.

Figure 3:
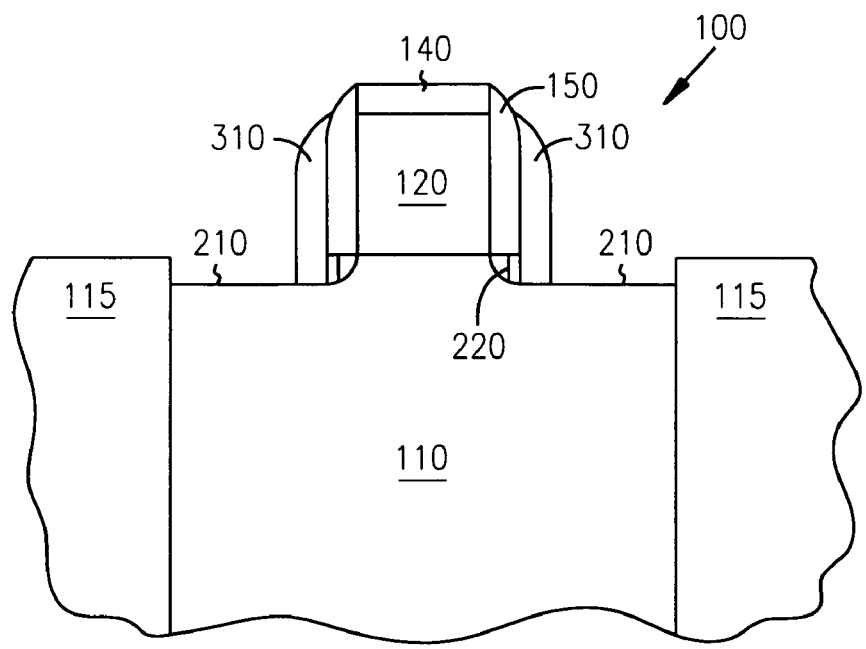

As shown in FIG. 3, a second spacer layer 310 is then formed over the first spacer layer 150 such that the formed second spacer layer 310 substantially extends from the formed first layer 210 in the substrate 110. In some embodiments, second spacer layer 310 is formed using a silicon nitride material. In some embodiments, a thin oxide layer is implanted on the exposed sidewalls 220 around the LDD regions 130 to protect the sidewalls 220 around the LDD regions 130 shown in FIG. 1 by thermal deposition of the oxide liner prior to the formation of the second spacer layer 310 over the first spacer layer. In these embodiments, the thickness of the formed oxide liner is around 20 to 100 Å.

Figure 4:
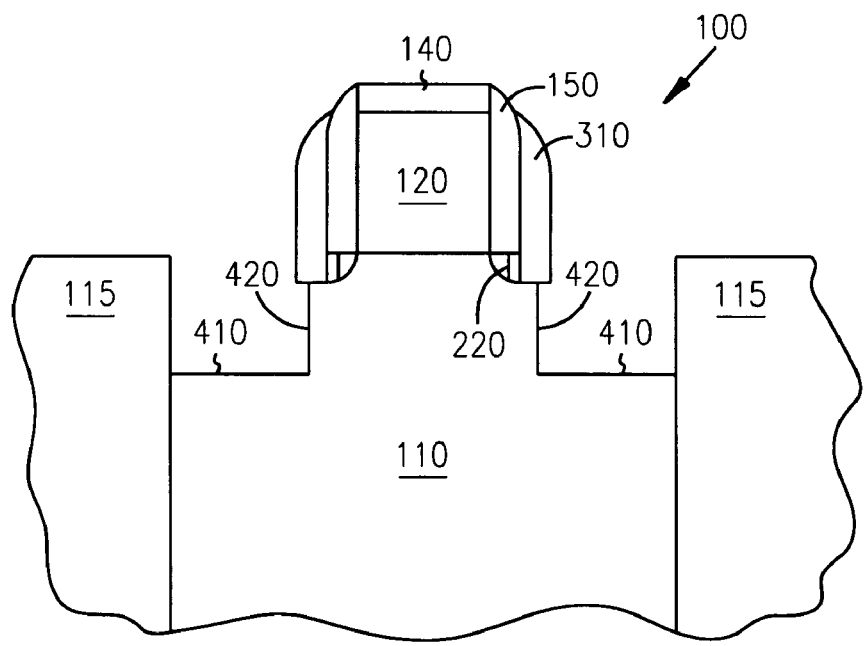

Referring to FIGS. 3 and 4, a second layer is then removed in the substrate 110 around the removed first layer 210. In these embodiments, second layer is removed using etchants that selectively etch the substrate 110 without etching the gate stack 120, the first spacer layer 150, the second spacer layer 310, and the field oxide layer 115 to further expose the substrate around the LDD regions 130 shown in FIG. 1 such that the exposed substrate extends the formed sidewall 220 further into the substrate 110 to form recesses 410 for the source and drain regions. The etching depth of the second layer can be higher than the source and drain regions formed in a later processing step. In some embodiments, the etching depth of the second layer is in the range of about 300 to 2000 Å. In these embodiments, etchants such as, $CF_4$ and $C_4F_6$ are used to remove the second layer.

Figure 5:
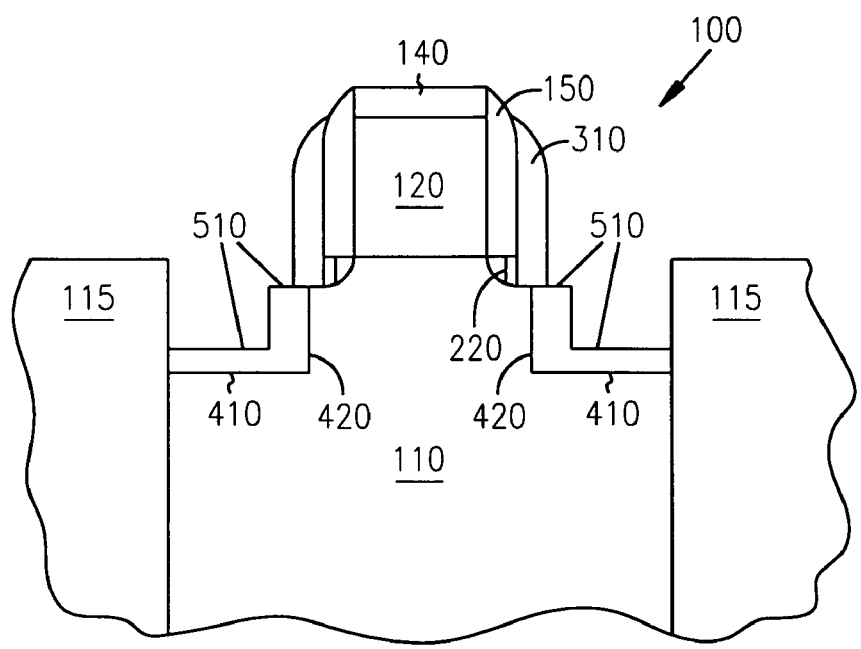

As depicted in FIGS. 4 and 5, an oxide layer 510 is then formed over the formed source and drain recesses 420 such that the formed second spacer layer 310 together with the formed oxide layer 510 substantially closes the exposed substrate in the source and drain recesses 410. In some embodiments, the oxide layer 510 is formed by growing a thermal oxide layer over the exposed substrate in the formed recesses 410. In some embodiments, the thermal oxide layer is grown in a furnace by exposing the source and drain recesses 420 to $O_2$ at a temperature of about 700 to 1000° C. for a period of about 10 to 39 minutes.

Figure 6:
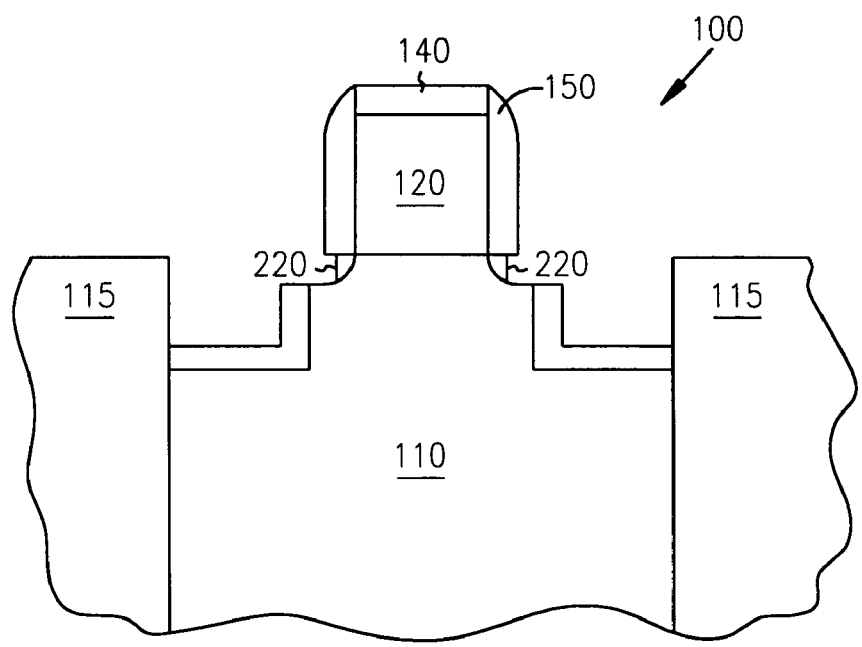

Referring to FIGS. 3 and 6, the second spacer layer 310 is then removed by selective etching to expose the closed LDD sidewalls 220. In some embodiments, the second spacer layer 310 is removed by selective nitride etching using hot phosphorous acid held around 120 to 170° C. to expose the closed LDD sidewalls 220

Figure 7:
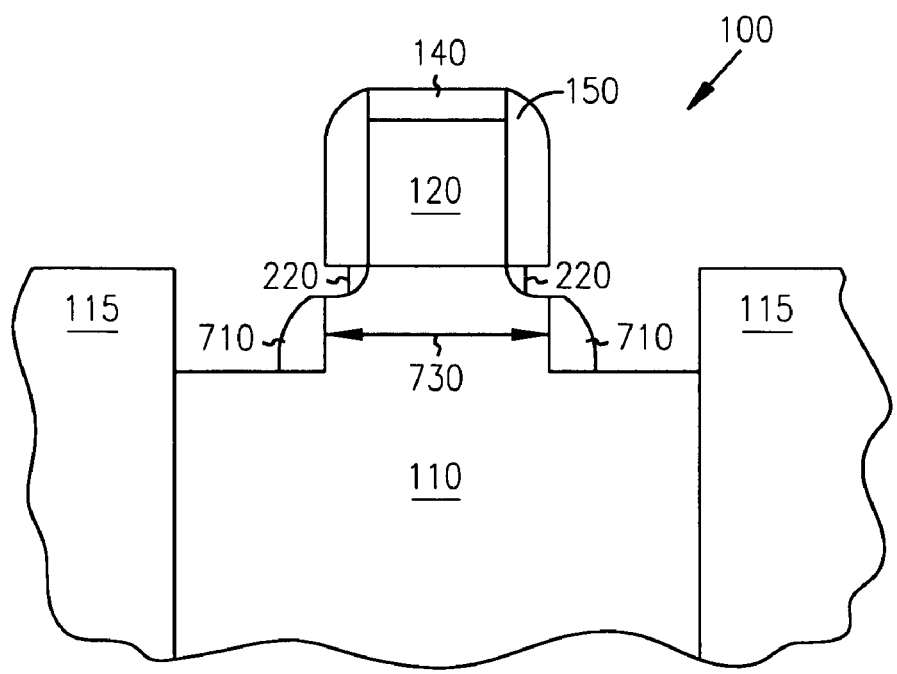

As shown in FIGS. 4, 5, and 7, the formed oxide layer 510 is then substantially removed from the source and drain recesses 410 by oxide spacer etching to expose the substrate 110 in the source and drain recesses 410 and to leave a portion of the oxide layer 510 shown in under the LDD regions and around the sidewalls 420 of the source and drain recesses 410 to form a dielectric plug 710 and a channel region 730 between the source and drain regions. In some embodiments, the second spacer layer 310 is removed after removing the formed oxide layer 510 from the source and drain recesses 410 to leave a portion of the oxide layer 510 under LDD regions 130 shown in FIG. 1. In some embodiments, oxide spacer etching is performed by dry etching using etchants such as, $CF_4$ and $C_4F_6$. Dielectric plug 710 can be formed using materials such as, silicon oxide ($SiO_2$), silicon nitride ($Si_3N_4$), or combination of $SiO_2$ and $Si_3N_4$. In some embodiments, the thickness of the formed dielectric plug is in the range of about of 50 to 500 Å.

Figure 8:
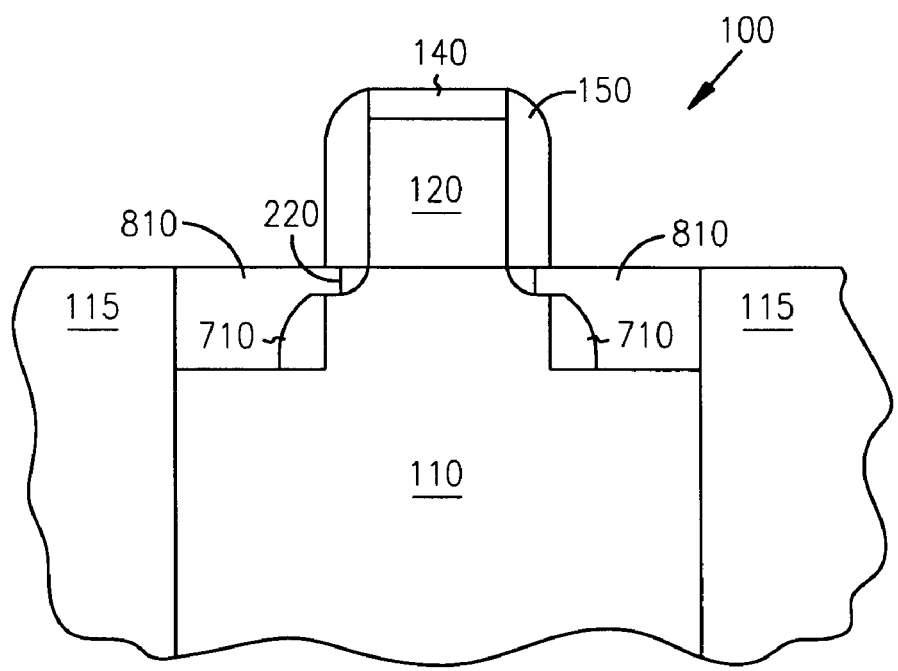

Referring to FIG. 8, epitaxial silicon material is then deposited in the source and drains recesses 810 such that the deposited epitaxial silicon fills the formed recesses to form the source and drain regions and to create a connection between the channel region 730 and the filled source and drain regions. In some embodiments, the sidewalls 220 around the LDD regions are pre-cleaned using a hydrogen fluoride (HF) dip prior to epitaxial silicon deposition to remove any oxide layer formed over and around the sidewalls 220 of the LDD regions. In some embodiments, a dopant is implanted over the formed source and drain regions 810, after the epitaxial silicon deposition to form P+ and N+ source and drain regions. The implanted dopant can include materials, such as arsenic, phosphorous, antimony, indium, and/or boron.

Figure 9:
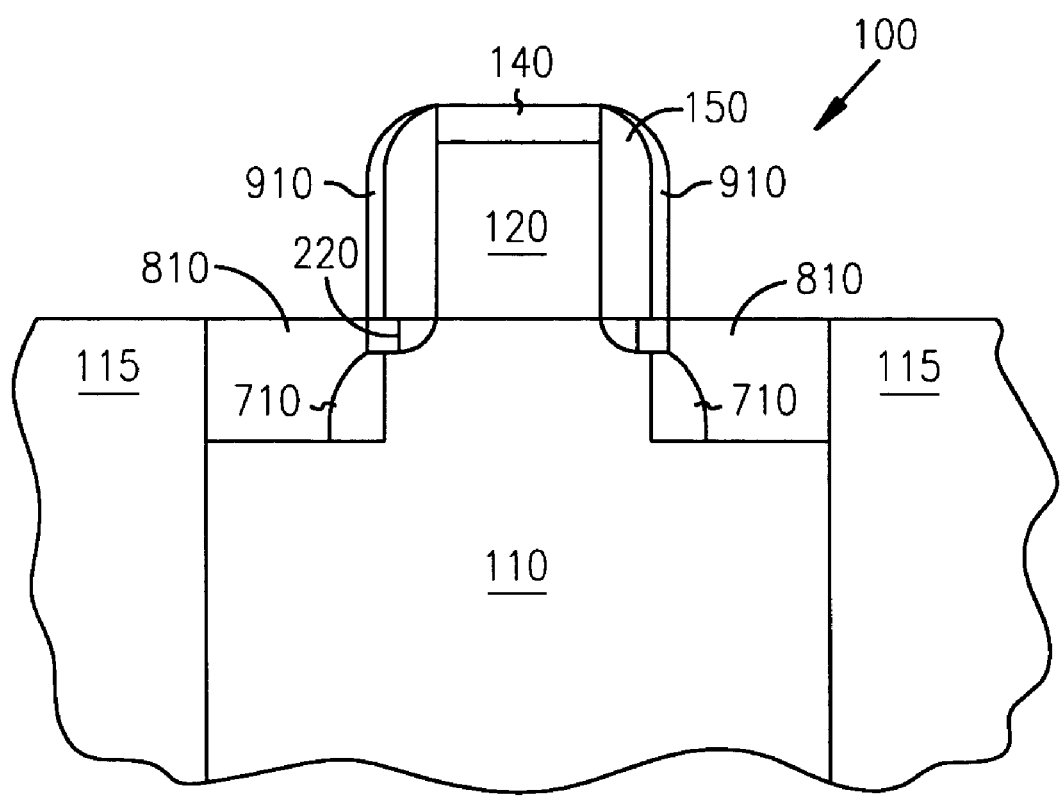
FIG. 9 is a cross sectional view of another embodiment of the MOSFET device having the dielectric plug shown in FIG. 8.

In some embodiments, LDD regions are formed after the formation of the dielectric plug 710 and the deposition of epitaxial silicon material in the source and drain regions to reduce lateral diffusion. In these embodiments, a portion of the first spacer layer 150 around the source and drain regions is then etched back to expose the silicon region such that the exposed regions are disposed substantially adjacent to the gate electrode stack 120 and the source and drain regions. The exposed regions are then implanted with a dopant to connect the channel region 730 to the source and drain regions. A third spacer layer 910 is then formed as shown in FIG. 9 over the gate electrode stack. In these embodiments, the third spacer layer 910 is formed to further space the formed P+ and N+ source and drain regions from the channel region 730.

Figure 10:
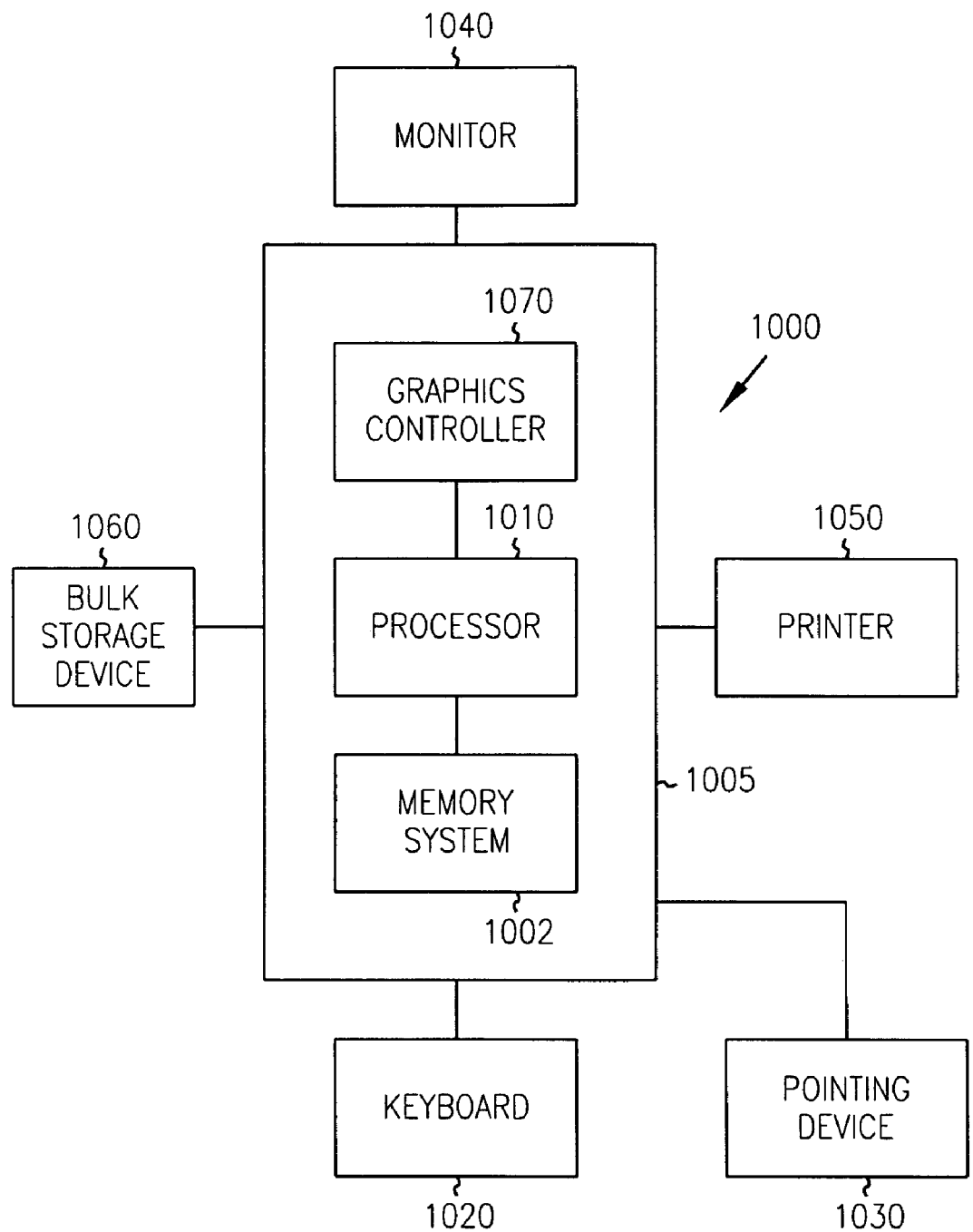
FIG. 10 is a block diagram of an exemplary computer system.

FIG. 10 is a block diagram of a system according to one embodiment of the present invention. Computer system 1000 contains a processor 1010 and a memory system 1002 housed in a computer unit 1005. Computer system 1000 is but one example of an electronic system containing another electronic system, e.g., memory system 1002, as a subcomponent. The memory system 1002 includes a memory device that includes a memory cell as discussed in various embodiments of the present invention. Computer system 1000 optionally contains user interface components. These user interface components include a keyboard 1020, a pointing device 1030, a monitor 1040, a printer 1050, and a bulk storage device 1060. It will be appreciated that other components are often associated with computer system 1000 such as modems, device driver cards, additional storage devices, etc. It will further be appreciated that the processor 1010 and memory system 1002 of computer system 1000 can be incorporated on a single integrated circuit. Such single-package processing units reduce the communication time between the processor and the memory circuit. Any of these components of the system may contain a memory device that includes the multiple-mode output driver of the present invention. This is particularly true of a graphics subsystem 1070 of FIG. 10 utilizing SGRAM that includes the multiple-mode output driver as discussed in various embodiments of the present invention.

Figure 11:
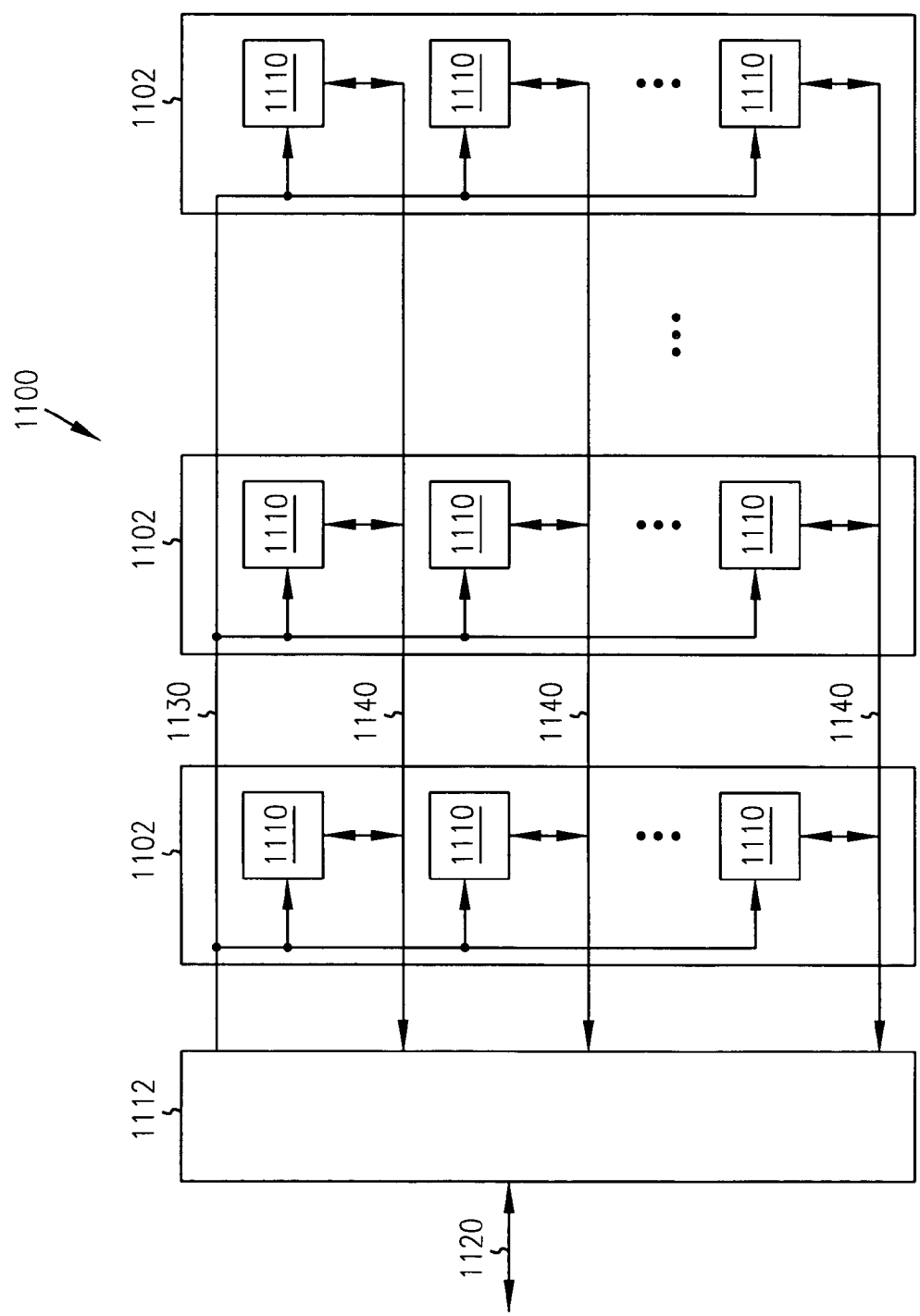
FIG. 11 is a block diagram of an exemplary memory system.

FIG. 11 is a block diagram of a system according to one embodiment of the present invention. Memory system 1100 contains one or more memory modules 1102 and a memory controller 1112. Each memory module 1102 includes at least one memory device 1110. Memory controller 1112 provides and controls a bi-directional interface between memory system 1100 and an external system bus 1120. Memory system 1100 accepts a command signal from the external bus 1120 and relays it to the one or more memory modules 1102 on a command link 1130. Memory system 1100 provides for data input and data output between the one or more memory modules 1102 and external system bus 1120 on data links 1140. At least one of the memory devices 1110 includes the memory cell as discussed in various embodiments of the present invention.

Figure 12:
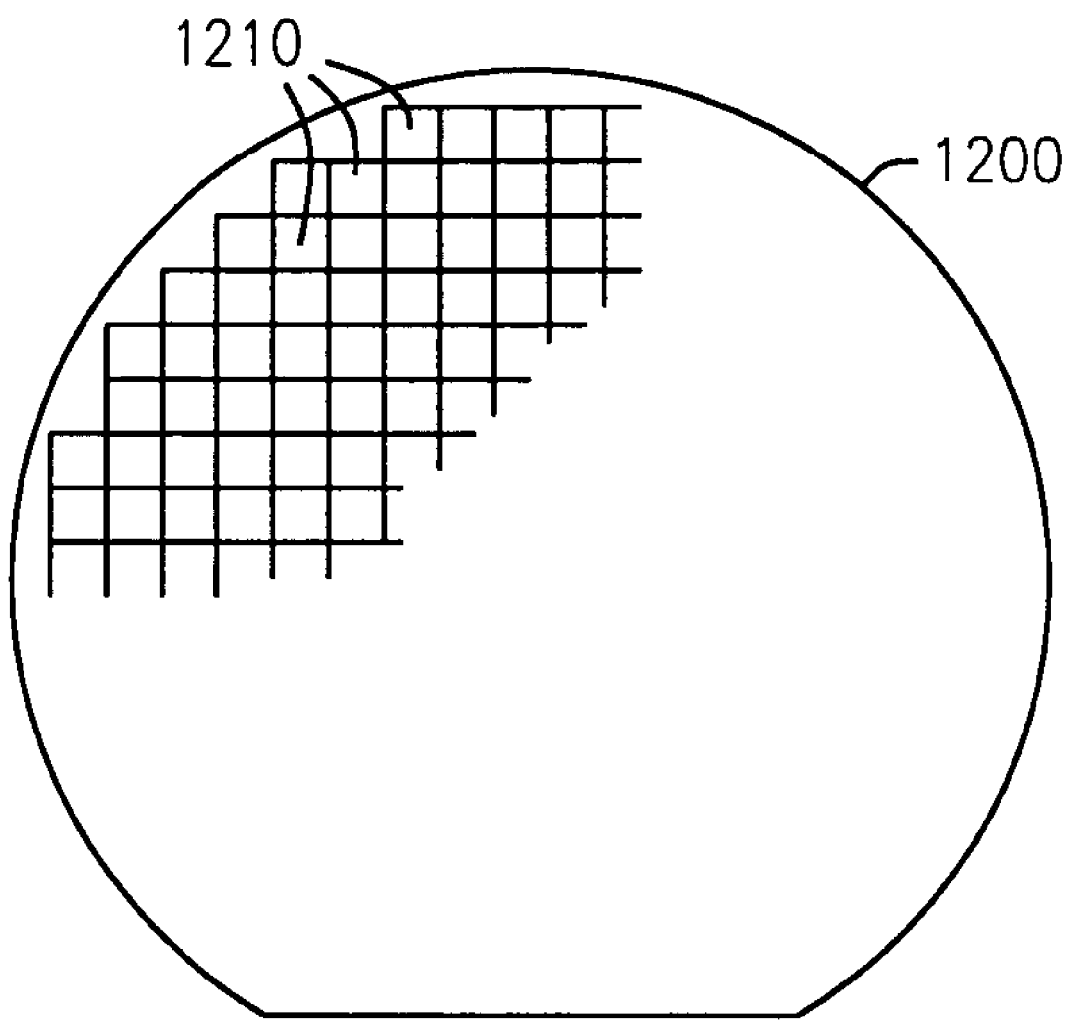
FIG. 12 is an elevation view of a substrate containing semiconductor dies.

With reference to FIG. 12, in one embodiment, a semiconductor die 1210 is produced from a silicon wafer 1200. A die is an individual pattern, typically rectangular, on a substrate that contains circuitry to perform a specific function. A semiconductor wafer will typically contain a repeated pattern of such dies containing the same functionality. Die 1210 may contain circuitry for the memory device, as discussed above. Die 1210 may further contain additional circuitry to extend to such complex devices as a monolithic processor with multiple functionality. Die 1210 is typically packaged in a protective casing (not shown) with leads extending therefrom (not shown) providing access to the circuitry of the die for unilateral or bilateral communication and control.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed is:

1. A short-channel Metal-Oxide-Silicon Field Effect Transistor (MOSFET) device, comprising:

a stacked gate over an active region surrounded by an isolation region on a substrate;

a protective cap layer over the gate electrode stack;

a pair of LDD regions disposed substantially adjacent to the gate electrode stack and apart from each other at opposite sides of the gate electrode stack;

a first spacer layer disposed around the gate electrode stack such that the disposed first spacer layer together with the disposed protective cap layer encloses the gate electrode stack;

source and drain recesses disposed adjacent to the LDD regions such that the source and drain recesses have a sidewall adjacent to the LDD regions and below the first spacer layer;

a dielectric spacer disposed substantially below the LDD regions and around the sidewalls of the source and drain recesses such that the dielectric spacer forms a channel region between the source and drain recesses; and source and drain regions comprising epitaxial silicon filling in the source and drain recesses and a layer of doped silicon region in the epitaxial silicon filling.

2. The device of claim 1, wherein the protective cap layer over the gate electrode stack is a dielectric material.

3. The device of claim 1, wherein the first spacer layer comprises an oxide, a nitride, $AL_2O_3$ or a combination thereof.

4. A semiconductor device, comprising:
a stacked gate over an active region surrounded by an isolation region on a substrate;
a dielectric protective cap layer over the gate electrode stack;
a pair of LDD regions disposed substantially adjacent to the gate electrode stack and apart from each other at opposite sides of the gate electrode stack;
a first spacer layer disposed around the gate electrode stack such that the disposed first spacer layer together with the disposed protective cap layer encloses the gate electrode stack;
source and drain recesses disposed adjacent to the LDD regions such that the source and drain recesses have a sidewall adjacent to the LDD regions and below the first spacer layer;
a dielectric spacer disposed substantially below the LDD regions and around the sidewalls of the source and drain recesses such that the dielectric spacer forms a channel region between the source and drain recesses; and
source and drain regions comprising epitaxial silicon filling in the source and drain recesses and a layer of conductive material in the epitaxial silicon filling.

5. The device of claim 4, wherein the first spacer layer comprises an oxide, a nitride, $AL_2O_3$ or a combination thereof.

6. The device of claim 4, wherein the dielectric material is selected from the group consisting of oxide, nitride, and $AL_2O_3$.

7. An integrated memory circuit device, comprising:
internal circuitry;
an array of memory cells, wherein each of the memory cells comprise:
a stacked gate over an active region surrounded by an isolation region on a substrate;
a cap layer over the gate electrode stack;
a pair of LDD regions disposed substantially adjacent to the gate electrode stack and apart from each other at opposite sides of the gate electrode stack;
a first spacer layer disposed around the gate electrode stack such that the disposed first spacer layer together with the disposed protective cap layer encloses the gate electrode stack;
source and drain recesses disposed adjacent to the LDD regions such that the source and drain recesses have a sidewall adjacent to the LDD regions and below the first spacer layer;
a dielectric spacer disposed substantially below the LDD regions and around the sidewalls of the source and drain recesses such that the dielectric spacer forms a channel region between the source and drain recesses; and
source and drain regions comprising epitaxial silicon filling in the source and drain recesses and a layer of doped silicon region in the epitaxial silicon filling.

8. The device of claim 7, wherein the substrate material is selected from the group consisting of silicon, SIGe, and silicon-on-insulator (SOI).

9. The device of claim 7, wherein the protective cap layer over the gate electrode stack is a dielectric material.

10. The device of claim 7, wherein the first spacer layer comprises an oxide, a nitride, $AL_2O_3$ or a combination thereof.

11. The device of claim 7, wherein the LDD regions are source and drain extension regions.

12. A logic circuit, comprising:
internal logic circuitry;
an array of memory cells, wherein each of the memory cells comprise:
a stacked gate over an active region surrounded by an isolation region on a substrate;
a protective cap layer over the gate electrode stack;
a pair of LDD regions disposed substantially adjacent to the gate electrode stack and apart from each other at opposite sides of the gate electrode stack;
a first spacer layer disposed around the gate electrode stack such that the disposed first spacer layer together with the disposed protective cap layer encloses the gate electrode stack;
source and drain recesses disposed adjacent to the LDD regions such that the source and drain recesses have a sidewall adjacent to the LDD regions and below the first spacer layer;
a dielectric spacer disposed substantially below the LDD regions and around the sidewalls of the source and drain recesses such that the dielectric spacer forms a channel region between the source and drain recesses; and
source and drain regions comprising epitaxial silicon filling in the source and drain recesses and a layer of conductive material in the epitaxial silicon filling.

13. The circuit of claim 12, wherein the substrate material is selected from the group consisting of silicon, SIGe, silicon-on-insulator (SOI), gallium arsenide (GaAs), and indium antimony (InSb).

14. The circuit of claim 12, wherein the protective cap layer over the gate electrode stack is a dielectric material.

15. The circuit of claim 12, wherein the first spacer layer comprises an oxide, a nitride, $AL_2O_3$ or a combination thereof.

* * * * *